United States Patent [19]

Berndlmaier et al.

[11] 4,346,343

[45] Aug. 24, 1982

[54] POWER CONTROL MEANS FOR ELIMINATING CIRCUIT TO CIRCUIT DELAY DIFFERENCES AND PROVIDING A DESIRED CIRCUIT DELAY

[75] Inventors: Erich Berndlmaier; Jack A. Dorler, both of Wappingers Falls; Joseph M. Mosley, Hopewell Junction; Stephen D. Weitzel, Poughkeepsie, all of N.Y.

[73] Assignee: International Business Machines Corporation, Armonk, N.Y.

[21] Appl. No.: 150,762

[22] Filed: May 16, 1980

[51] Int. Cl.³ ............................................... G05F 1/46
[52] U.S. Cl. ................................. 323/282; 367/296 R
[58] Field of Search ................... 323/282; 307/296 R, 307/511, 516

[56] References Cited

U.S. PATENT DOCUMENTS

| | | |
|---|---|---|
| Re. 29,619 | 4/1978 | Pastoriza . |
| 3,271,688 | 9/1966 | Gschwind et al. . |
| 3,602,799 | 8/1971 | Guillen . |
| 3,736,477 | 5/1973 | Berger et al. . |
| 3,743,850 | 4/1973 | Davis . |
| 3,743,850 | 7/1973 | Davis . |
| 3,754,181 | 8/1973 | Kreitz . |
| 3,758,791 | 9/1973 | Taniguchi et al. . |
| 3,778,646 | 12/1973 | Masaki . |
| 3,794,861 | 2/1974 | Bernacchi . |
| 3,803,471 | 4/1974 | Price et al. . |
| 3,808,468 | 4/1974 | Ludlow . |
| 3,849,671 | 11/1974 | Molack . |
| 3,870,900 | 3/1975 | Malaviya . |
| 3,931,588 | 1/1976 | Gehweiler . |
| 3,970,919 | 7/1976 | Butcher . |
| 3,978,473 | 8/1976 | Pastoriza . |
| 4,004,164 | 1/1977 | Crawford, Jr. et al. . |
| 4,017,750 | 4/1977 | Voorman . |
| 4,029,974 | 6/1977 | Brokaw . |
| 4,065,709 | 12/1977 | Sliwa et al. . |
| 4,100,431 | 7/1978 | Stipanuk . |
| 4,145,621 | 3/1979 | Colaco . |
| 4,160,934 | 7/1979 | Kirsch . |
| 4,172,992 | 10/1979 | Culmer et al. . |
| 4,216,544 | 8/1980 | Boleda et al. . |
| 4,287,437 | 9/1981 | Brosch et al. . |

OTHER PUBLICATIONS

IBM Technical Disclosure Bulletin, "Speed Normalization of Logic Circuits", J. A. Parisi & J. A. Petrosky, Vol. 17, No. 10, Mar. 1975, pp. 2913-2914.

IBM Technical Disclosure Bulletin, "Current Source Generator", G. Keller et al., Vol. 12, No. 11, Apr. 1970, p. 2031.

IBM Technical Disclosure Bulletin, "Precision Integrated Current Source," A. Cabiedes et al., Vol. 13, No. 6, Nov. 1970, p. 1699.

IBM Technical Disclosure Bulletin, "Voltage Reference Buffer", J. A. Dorler et al., Vol. 14, No. 7, Dec. 1971, p. 2095.

IBM Technical Disclosure Bulletin, "Adjustable Underfrequency-Overfrequency Limiting Circuit", W. B. Nunnery, Vol. 15, No. 6, Nov. 1972, pp. 1927-1929.

IBM Technical Disclosure Bulletin, "Reference Voltage Generator and Off-Chip Driver for Current Switch Circuits", A. Brunin, Vol. 21, No. 1, Jun. 1978, pp. 219-220.

IBM Technical Disclosure Bulletin, "Gated Current Source", J. W. Spencer, Jr., Vol. 21, No. 7, Dec. 1978, pp. 2719-2720.

Electronic Design 6, "Integrated Injection Logic Shaping Up as Strong Bipolar Challenge to MOS", Mar. 15, 1974, pp. 28 & 30.

Electronics, "I²L Puts It All Together for 10-Bit A-D Converter Chip", Paul Brokow, Apr. 13, 1978, pp. 99-105.

"Delay Regulation A Performance Concept", Erich Berndlmaier, Jack Dorler, Joseph Mosley, Stephen Weitzel, Proceedings IEEE International Conference on Circuits and Computers, ICCC80, Vol. 2 of 2, edited by N. B. Guy Rabbat, Oct. 1-3, 1980, Ryetown Hilton Inn, Portchester, N. Y., pp. 701-704.

IBM Technical Disclosure, "Chip Performance Regulator Using On-Chip Voltage Controlled Oscillator", K. R. King, Vol. 23, No. 7A, Dec. 1980, pp. 2631-2632.

Primary Examiner—William M. Shoop
Attorney, Agent, or Firm—Wesley De Bruin

[57] ABSTRACT

An on chip delay regulator circuit which varies the power in logic or array circuits on the chip so as to minimize, or eliminate, chip to chip circuit speed differences caused by power supply variations and/or lot to lot process differences, temperature, etc.

The on chip delay regulator accomplishes this by comparing a reference signal to an on chip generated signal which is sensitive to power supply changes, lot to lot process changes, temperature, etc. The comparison creates an error signal which is used to change the power (current or voltage) supplied to the on chip circuits. By changing the circuit power, the circuit speed (gate delay) is increased or decreased as necessary to maintain a relatively constant circuit speed on each chip.

For example, a plurality of integrated circuit chips each contain an on chip delay regulator. The on chip delay regulator on each chip of said plurality of integrated circuit chips receives and responds to the same signal (or clock). Each chip provides a discrete on chip generated signal related to the parameters of the chip. The gate delay (or speed) of the circuitry on each chip is determined by its on chip delay regulator under control of the common reference signal (or clock).

27 Claims, 19 Drawing Figures

REFERENCE GENERATOR

LOW PASS FILTER $V_{CO}$ (RLF)

TYPICAL GATE

BUFFER (POWER AMPLIFIER)

LEVEL SHIFT

INTERNAL GATE

POWER CONTROL MEANS FOR ELIMINATING CIRCUIT TO CIRCUIT DELAY DIFFERENCES AND PROVIDING A DESIRED CIRCUIT DELAY

FIELD OF THE INVENTION

A circuit which varies the power in logic or array circuits so as to minimize, or eliminate, chip to chip circuit speed differences caused by variations of power supply, lot to lot process differences, temperature, etc.

This is accomplished by comparing a reference signal to an on chip generated signal which is sensitive to power supply, lot to lot process changes, temperature, etc. The comparison creates an error signal which is used to change the power (current or voltage) supplied to the on chip circuits. By changing the circuit power, the circuit speed is increased or decreased as necessary to maintain a constant speed.

CROSS REFERENCE TO RELATED APPLICATIONS

U.S. patent application Ser. No. 098,439 entitled "Method and Circuitry For Equalizing The Differing Delays of Semiconductor Chips", filed Nov. 29, 1979 by R. Brosch et al. and, granted as U.S. Pat. No. 4,287,437 on Sept. 1, 1981 of common assignee herewith.

BACKGROUND OF THE INVENTION AND PRIOR ART

The current method of circuit design is to create logic circuits and array circuits which operate at a specific power level. There are numerous teachings in the art of circuits used to maintain a specific power level or specific current level within a logic gate. In particular, current switch technology has additional circuitry on the chip to minimize current level changes within the logic gate while temperature, power supplies, and lot to lot processes vary. FIG. 1 shows a typical logic speed power curve with an arrow showing the current design practice—pick a power level, maintain the power level and accept the resulting circuit speed (gate delay). The design problem is trying to minimize the performance changes under a variety of conditions. The gate delay versus power curve in FIG. 1 can move in any direction and even change slope. At the same time, the power regulating circuitry has its own perturbations. These result in a wide distribution of logic gate speeds.

FIG. 2 shows a gate delay versus power curve used to illustrate the preferred design technique in accordance with the invention. The speed or delay of the logic gate is selected and the power within the circuit is adjusted to achieve this speed. This is accomplished by designing on chip circuitry sensitive to the transient performance characteristics of the on chip logic or array circuits. This special circuitry (delay regulator) will generate a signal indicative of the chip performance (speed vs. power characteristic) to be compared to a system wide periodic reference signal or clock. The comparison creates a signal which controls the power in the logic and/or array circuitry on chip thereby controlling the performance. [Namely, the point on gate delay versus power curve which corresponds to a fixed gate delay]. By connecting the reference signal to all of the chips in the system, all of the chips will have the same relative performance, i.e. gate delay or speed. Since this is a continuous comparison between the reference signal and the on chip signal, many variables affecting performance, such as power supply, temperature changes, chip to chip process variations, etc. will be minimized or eliminated.

With reference to U.S. patent numbers and publications, a number of prior art disclosures and teachings in the field of integrated circuits are briefly discussed hereinafter.

Reference is made to U.S. Pat. No. Re. 29,619 entitled "Constant-Current Digital-to-Analog Converter" granted Apr. 25, 1978, to J. J. Pastoriza. The Pastoriza patent discloses a digital-to-analog converter the output circuit of which comprises a set of switching transistors arranged as current generators. The currents through the switching transistors are maintained constant by means of a supply voltage adjusting circuit comprising a separate reference transistor matched to one of the switching transistors and energized by the same voltage supply lines as the switching transistors. The supply voltage adjusting circuit includes an operational amplifier which senses the collector current of the reference transistor, and adjusts the supply voltage so as to maintain that collector current constant. This automatic adjustment of the supply voltage also maintains the current through the switching transistors constant.

Reference is made to U.S. Pat. No. 3,602,799 entitled "Temperature Stable Constant Current Source" granted Aug. 31, 1971 to F. J. Guillen. The Guillen patent discloses an ultrastable high speed constant DC current source for generating a precise reference voltage in other apparatus such as a high-speed analogue to digital converter. A continuous constant load current is selectively switched between two current paths, one of which comprises an output load across which said reference voltage is developed. A high-speed digitally controlled driver circuit including a differential amplifier configuration controls the flow of the constant current selectively through one of two hot carrier diodes. The diodes serve as electronic switches from the constant current source which comprises an operational amplifier connected in a feedback loop including a Darlington transistor configuration and controlled by an extremely applied input reference voltage and an error signal developed by the flow of said load current across a temperature compensated resistor.

Reference is made to U.S. Pat. No. 3,743,850 entitled "Integrated Current Supply Circuit" granted July 3, 1973 to W. F. Davis. In the Davis patent, DC biasing currents for a monolithic integrated circuit are obtained from a single regulated current reference source applying current through first and second series connected diodes to establish points of reference potential. Some of the current source transistors which are referenced to this regulated current source have the base-emitter junctions thereof connected across the first diode, and the emitter current of these current source transistors is collected and added to the current from the regulated current source and supplied through the second diode. This second diode, with a larger regulated current flowing therethrough is used to reference additional current without necessitating the use of high ratio area scaling of the emitter areas of these current source transistors.

Reference is made to U.S. Pat. No. 3,754,181 entitled "Monolithic Integrable Constant Current Source For Transistors Connected As Current Stabilizing Elements" granted Aug. 21, 1973 to W. Kreitz et al. The Abstract of the Kreitz et al. patent reads as follows:

"To reduce sensitivity to battery voltage variation in a multiple transistor monolithically integrated constant current source, the control transistor is replaced by an amplifier. Only a fraction of the sum of base currents of the source transistors is applied to the input of the amplifier. Also, the number of source transistors is not as limited by current gain factor as it is when a control transistor is used."

Reference is made to U.S. Pat. No. 3,758,791 entitled "Current Switch Circuit" granted Sept. 11, 1973 to K. Taniguchi et al. The Taniguchi et al. patent discloses a current switch circuit consisting of a couple of transistors, one transistor acting as a reference element and the other as an input element a pair of series connections of a resistant element and a diode being connected between the respective collectors of the said transistors with the polarity of the diodes opposite to each other, so that the emitter current of the transistors are automatically regulated to maintain a predetermined value, whereby the DC levels of the output voltages of the current switch circuit are kept constant against temperature variation of the transistors.

Reference is made to U.S. Pat. No. 3,778,646 entitled "Semiconductor Logic Circuit" granted Dec. 11, 1973 to A. Masaki. The Masaki patent discloses a current mode type semiconductor logic circuit comprising at least one grounded-emitter transistor through which a power source is connected to the logic circuit. The output of the logic circuit is fed back to the grounded-emitter transistor through a feedback circuit. As a result, the variation in the output of the logic circuit can be controlled to a minimum even when the load of the logic circuit is varied.

Reference is made to U.S. Pat. No. 3,794,861 entitled "Reference Voltage Generator" granted Feb. 26, 1974 to J. R. Bernacchi. The Bernacchi patent discloses a reference voltage generator circuit particularly suited for current source circuits having low temperature sensitivity and low voltage sensitivity. The circuit is comprises of a reference voltage circuit having low voltage sensitivity and relatively high temperature sensitivity, with an additional feedback circuit for feeding back a compensating temperature sensitivity to result in a low overall sensitivity. The temperature sensitivity of the reference generator is predominately due to the temperature sensitivity of a base to emitter diode voltage drop which may be selectively controlled or substantially cancelled by the proper selection of resistors in the feedback circuit so as to feed back a temperature sensitive component. The feedback signal is dependent upon the difference in the base to emitter voltage drops in two transistors conducting different magnitudes of current, and is similarly amplified so as to effectively allow cancellation of the basic reference generator sensitivity.

Reference is made to U.S. Pat. No. 3,803,471 entitled "Variable Time Ratio Control Having Power Switch Which Does Not Require Current Equalizing Means" granted Apr. 9, 1974 to R. G. Price et al. The Price et al. patent discloses a pulse width modulation control having a power switch arrangement which does not require external current equalization means has a plurality of paralleled power transistors whose forward current transfer ratio decreases abruptly with increase in collector current and whose base drive is supplied by a constant current switching regulator having a plurality of paralled clamping transistors in shunt to the regulator output terminals which are turned on by variable width pulses to shunt current away from the power transistors and thereby turn the power switch off and on. The regulator output is coupled to the base of each power transistor by a diode whose forward drop promotes base current sharing and which prevents multiple transistor failure.

Reference is made to U.S. Pat. No. 3,808,468 entitled "Bootstrap FET Driven With ON-Chip Power Supply" granted Apr. 30, 1974 to P. J. Ludlow et al. The Ludlow et al. patent discloses a bootstrap FET driver amplifier having a precharged relatively higher gate voltage and a relatively lower drain voltage obtained from a common power source. The gate voltage is derived from recurrent pulses produced by an on-chip FET free-running multi-vibrator and a voltage amplifier circuit powered from said power source. The pulse width of the recurrent pulses varies as an inverse function of the transconductance of the on-chip FETs and as a direct function of the threshold voltage of the on-chip FETs. The pulse width controls the charging time of a voltage booster capacitor in the voltage multiplier circuit whereby the amplitude of the boosted voltage is a direct function of the pulse width. The boosted voltage is applied to the gate of the bootstrap FET driver amplifier.

Reference is made to U.S. Pat. No. 3,978,473 entitled "Integrated-Circuit Digital to Analog Converter" granted Aug. 31, 1976 to J. J. Pastoriza. The Pastoriza patent discloses a digital-to-analog converter comprising an IC switch module providing four switch transistors and associated switch-control buffering circuitry. The emitter areas of the switch transistors are binarily weighted to provide equal current densities. The IC substrate also is formed with a fifth transistor to serve as a reference transistor for adjusting the supply voltage as necessary to maintain constant current through the switch transistors. To construct a digital-to-analog converter having a high bit resolution, a number of such "quad" switch modules may be combined, for example, in a printed circuit card assembly including a thin-film resistor module providing binarily-weighted resistors on a glass substrate to set the current levels through the switch transistors.

Reference is made to U.S. Pat. No. 4,004,164 entitled "Compensating Current Source" granted Jan. 18, 1977 to H. C. Cranford. The Cranford patent discloses a circuit to provide a current source for use on a semiconductor chip having field effect transistors (FET) deposited therein to compensate for variations in the substrate voltage source. Analog type circuits when alone on a semiconductor chip or combined with digital type logic circuits are normally susceptible to disturbances in the bias voltage applied to the substrate of the chip. The obtaining of a uniform output response from an analog type circuit due to an input voltage change has heretofore required the use of off-chip precision voltage sources. Such expensive precision sources can be eliminated and normally variable (+15%) supplies can be used by providing an on-chip compensating current source which combines with other circuits to provide stable reference voltage levels on the chip for use by the analog circuits.

The compensating circuit comprises two depletion type field effect transistors (FET) in series between a higher voltage source and the substrate voltage, the FET connected to the higher voltage having its gate connected to the common node between the transistors and being in saturation and the lower voltage one having its gate connected to a ground voltage and being conductive in its linear region. An enhancement type transistor has its gate connected to the common node of the two depletion FETs and its source connected to the negative side of the substrate voltage source. By a proper selection of parameters, this circuit will pass a current varying inversely with changes in the substrate supply voltage to provide a compensated current source for other analog circuits. Representative circuits are shown for a stabilized voltage reference, for a differential amplifier current control and a combined circuit.

Reference is made to U.S. Pat. No. 4,029,974 entitled "Apparatus for Generating A Current Varying With Temperature" granted June 14, 1977 to A. P. Brokaw. The Brokaw patent discloses a digital-to-analog converter of the type formed with a plurality of current source transistors arranged to carry different levels of current according to a predetermined weighting pattern, e.g., a binary weighting pattern. In the converter, a plurality of identically sized current source transistors carry the different levels of current and thus operate at different current densities with different base-to-emitter voltages subject to temperature drift. Stable emitter voltages, providing accurate levels of weighted current, are developed by means of resistances between the bases of successive current source transistors and a current source for developing across the interbase resistances a voltage linearly varying with absolute temperature, corresponding to the difference between base-to-emitter voltages of the successive current source transistors.

The apparatus for generating a current linearly varying with absolute temperature is formed with first and second transistors forced to carry the same current at different current densities to produce different base-to-emitter voltages, and means such as an emitter resistor responsive to the difference in the base-to-emitter voltages for developing a current, corresponding to the difference in base-to-emitter voltages, which varies linearly with temperature.

Reference is made to U.S. Pat. No. 4,100,431 entitled "Integrated Injection Logic to Linear High Impedance Current Interface" granted July 11, 1978 to J. J. Stipanuk. The Stipanuk patent discloses an interface circuit for interconnecting an integrated injection logic (I²L) portion of an integrated circuit to a linear portion of an integrated circuit. The circuit transfers both logic information and I²L current level references from the I²L circuitry to the linear circuitry at the relatively large voltage levels present in linear circuitry. One embodiment employs a cascode arrangement involving one transistor, two diodes and a resistor. Another embodiment utilizes the matching characteristics of a pair of transistors operating in the forward and reverse modes respectively to perform the function with only one transistor.

Reference is made to U.S. Pat. No. 4,145,621 entitled "Transistor Logic Circuits" granted Mar. 20, 1979 to S. F. Colaco. The Colaco patent discloses a transistor logic circuit including a constant current source in the form of a current mirroring arrangement connected to a logical gating combination of switching transistors, the arrangement being such that the switching transistors do not saturate.

Reference is made to U.S. Pat. No. 4,160,934 entitled "Current Control Circuit For Light Emitting Diode" granted July 10, 1979 to H. C. Kirsch. In the Kirsch patent, the current in a semiconductive light emitting diode (LED), driven by an insulated gate field effect transistor (IGFET) switch, is stabilized by a current control circuit including a comparator type feedback network, which stabilizes the voltage at a node located between said switch and the series connection of a ballast resistor and the LED.

Reference is made to U.S. Pat. No. 4,172,992 entitled "Constant Current Control Circuit" granted Oct. 30, 1979 to D. D. Culmer et al. In the Culmer et al. patent, a pair of transistors are operated at different current densities so as to develop a differential base to emitter potential. This potential is used as a reference in a negative feedback stabilization circuit which passes a current that is regulated by the potential. The circuit can also regulate the currents flowing in a plurality of additional current sources and sinks connected thereto.

Reference is made to U.S. Pat. No. 3,736,477 entitled "Monolithic Semiconductor Circuit For A Logic Circuit Concept of High Packing Density" granted May 29, 1973 to H. H. Berger et al. The Berger et al. patent discloses basic I²L structure and circuitry.

Reference is made to the following IBM Technical Disclosure Bulletin Publications:
(1) "Current Source Generator" by G. Keller et al. Vol. 12, No. 11, April 1970, page 2031;
(2) Precision Integrated Current Source" by A. Cabiedes et al., Vol. 13, No. 6, November 1970, page 1699;
(3) "Voltage Reference Buffer" by J. A. Dorler et al., Vol. 14, No. 7, December 1971, page 2095;
(4) "Adjustable Underfrequency-Overfrequency Limiting Circuit" by W. B. Nunnery, Vol. 15, No. 6, November 1972, pages 1927–9;
(5) "Reference Voltage Generator and OFF-Chip Driver For Current Switch Circuit" by A. Brunin, Vol. 21, No. 1, June 1978, pages 219–20; and
(6) "Gated Current Source" By J. W. Spencer Jr., Vol. 21, No. 7, December 1978, pages 2719–20.

Reference is also made to the following publications:
(1) "Integrated Injection Logic Shaping Up As Strong Bipolar Challenge to MOS", Electronic Design 6, Mar. 15, 1974, pages 28 and 30.
(2) "I²L Puts It All Together For 10-bit A–D Converter Chip" by Paul Brokaw, Electronics, Apr. 13, 1978, pages 99–105.

SUMMARY OF THE INVENTION

The invention may be summarized as an electronic system including one or more integrated circuit chips, each of said one or more integrated circuit chips having a plurality of interconnected logic and/or array circuits thereon, each of said logic and/or array circuits having a gate delay versus power curve, said system being characterized by the inclusion of power control means for regulating the power to each of said one or more chips whereby the power provided to said logic circuits on said one or more chips may vary chip to chip but said gate delay of said logic circuits on each of said chips will be essentially equal one to another.

The invention may also be summarized as a system including N interconnected integrated circuit chips, where N is an integer positive number, each of said N interconnected integrated circuit chips containing a delay regulator means and at least first, second and third interconnect logic circuits, said logic circuits on each of said chips having a relatively unique speed/power characteristic; a source of periodic clock pulses, said delay regulator means of each of said N interconnected circuit chips being adapted to receive said period clock pulses, each of said delay regulator means including active circuit means for generating an electrical manifestation related to said periodicity of said periodic clock pulses and said speed/power characteristic of the logic circuits on the chip on which it is contained; and connecting means on each of said N interconnected integrated circuit chips, said connection means on each of said N interconnected integrated circuit chips conveying the electrical manifestation generated by the delay regulator means on said chip to said logic circuits on said same chip, whereby the power provided to said logic circuits on said chips may vary chip to chip but said speed of said logic circuits on each of said chips will be essentially equal one to another.

The invention as summarized in the preceding paragraph wherein each of said delay regulator means essentially consists of a phase locked loop.

BRIEF DESCRIPTION OF THE DRAWINGS

Referring to FIG. 3, it will be recalled that each chip contains a Delay Regulator. The circuit of the Delay Regulator of each chip may be the same. Each of the blocks in FIG. 4 encloses a legend and a figure number. For example, the phase comparator block has the legend "φ Compare" and "(FIG. 5)", whereas the voltage controlled oscillator includes the legend "VCO (RLF)" and "(FIG. 8)". These legends denote that the logical circuit of the φ compare circuit is shown in FIG. 5 and the logical circuit of the voltage controlled oscillator is shown in FIG. 8. In the illustrative embodiment of the invention, the Delay Regulator comprises a "φ compare circuit (FIG. 5)", a "Low Pass Filter (FIG. 6)", a "Buffer Circuit or Power Amplifier Circuit (FIG. 7)", a "Voltage Controlled Oscillator RLF (FIG. 8)", and a "Level Shift Circuit (FIG. 9)" interconnected as shown in FIG. 4. It will be appreciated by persons skilled in the art that a current controlled oscillator may be employed in lieu of the voltage controlled oscillator.

Figure 8:
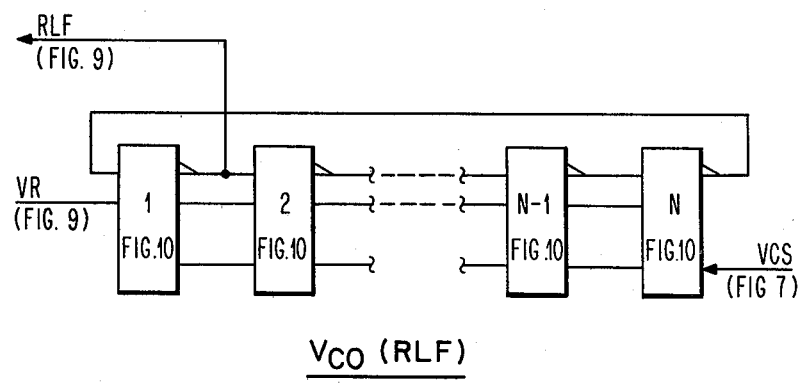
FIG. 8 discloses a Voltage Controlled Oscillator (RLF) which may be employed, in accordance with the invention, in the Delay Regulator (FIG. 4).
Figure 10:
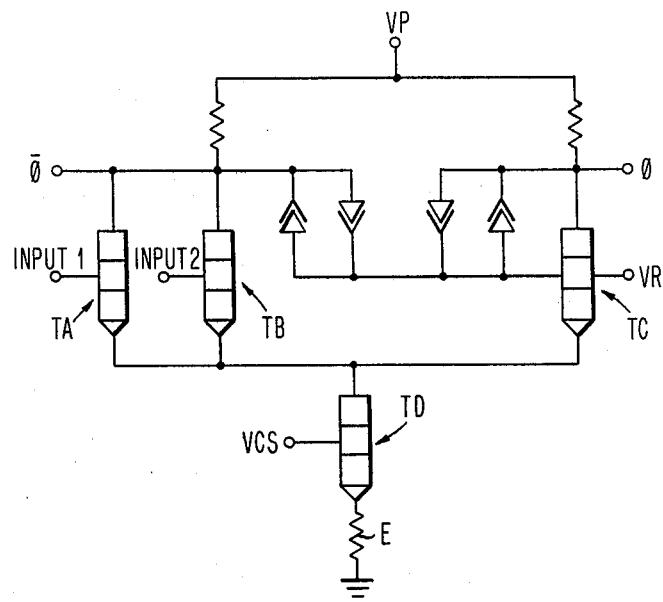

It is to be noted that the Voltage Controlled Oscillator preferably employs a plurality of logic circuits of the type whose gate delay (or speed) is to be regulated by the Delay Regulator. In the illustrative embodiment of the invention disclosed herein, the logic circuit whose gate delay (or speed) is to be controlled is a current switch (or ECL) as shown in FIG. 10. The Voltage Controlled Oscillator may take the form of a recirculating loop frequency (RLF) as shown in FIG. 8 wherein the total number of inversions is odd.

Figure 4:
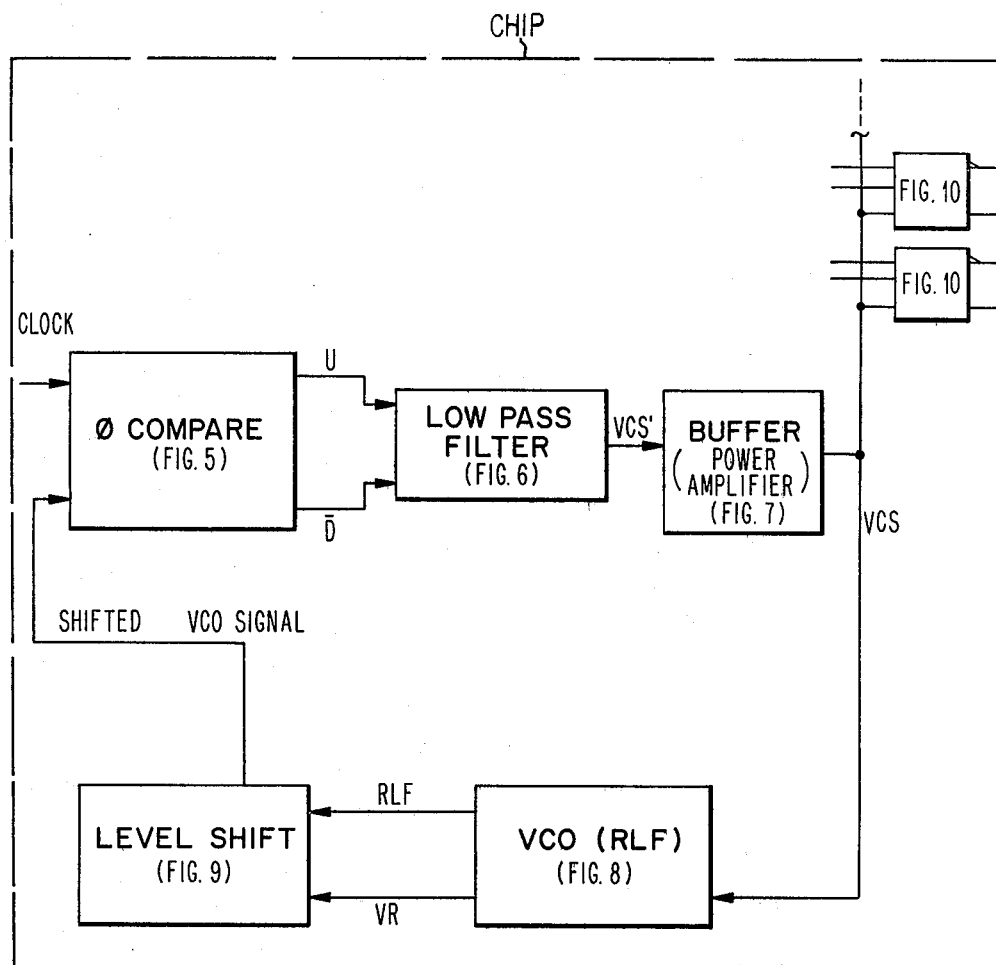
FIG. 4 is a block diagram of a Delay Regulator (Power Control Means) in accordance with the invention.
Figure 9:
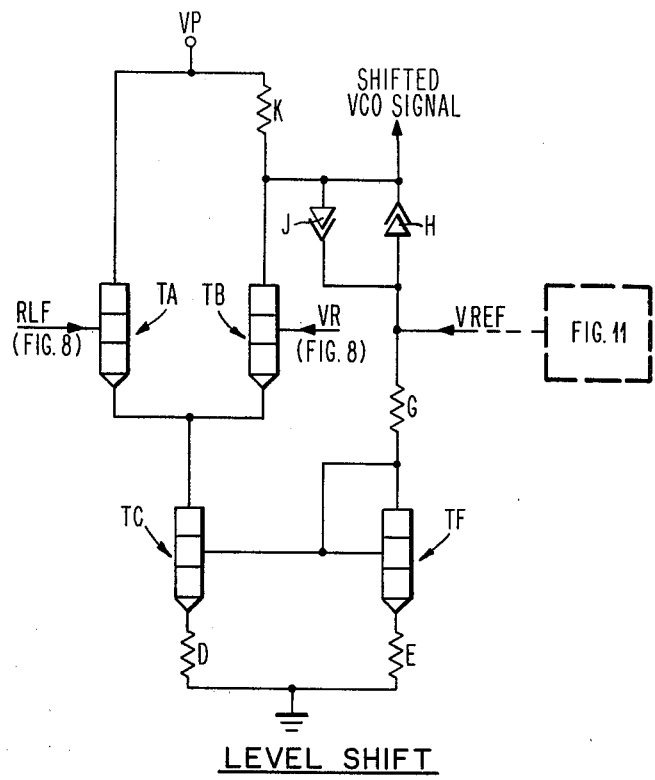

FIG. 9 discloses a Level Shifter circuit which may be employed, in accordance with the invention, in the Delay Regulator (FIG. 4).

FIG. 10 is a representative current switch logic (ECL) circuit whose gate delay (or speed) is regulated, in accordance with the invention, by the Delay Regulator.

Figure 11:
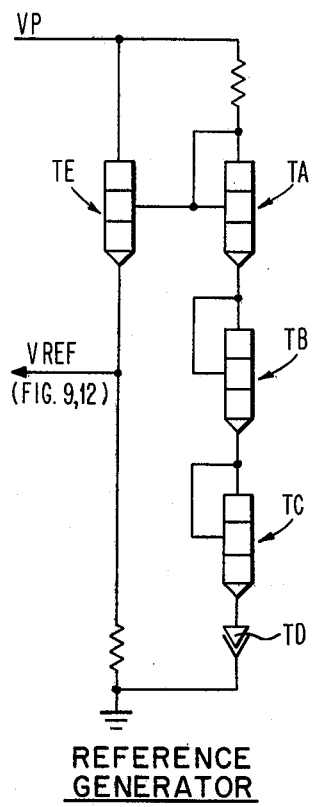
Figure 12:
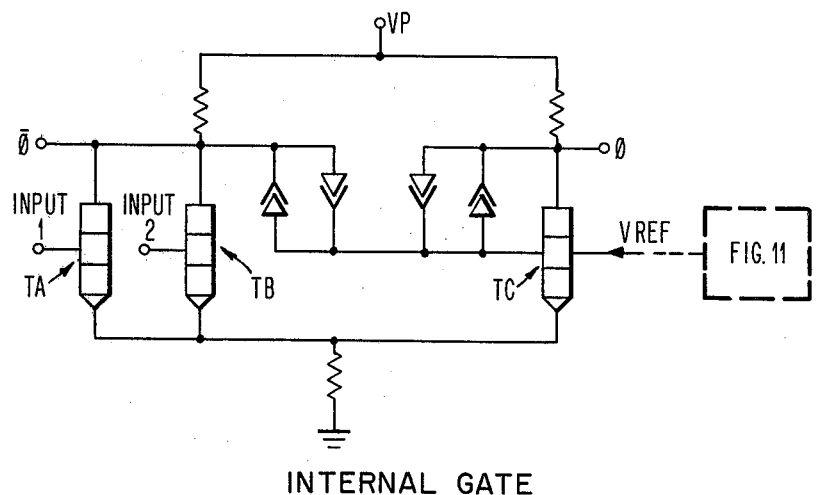

FIG. 11 discloses a reference voltage generator for providing a reference voltage Vref which may be utilized by the level shift circuit of FIG. 9 and the Internal Gate circuit of FIG. 12.

Figure 5:
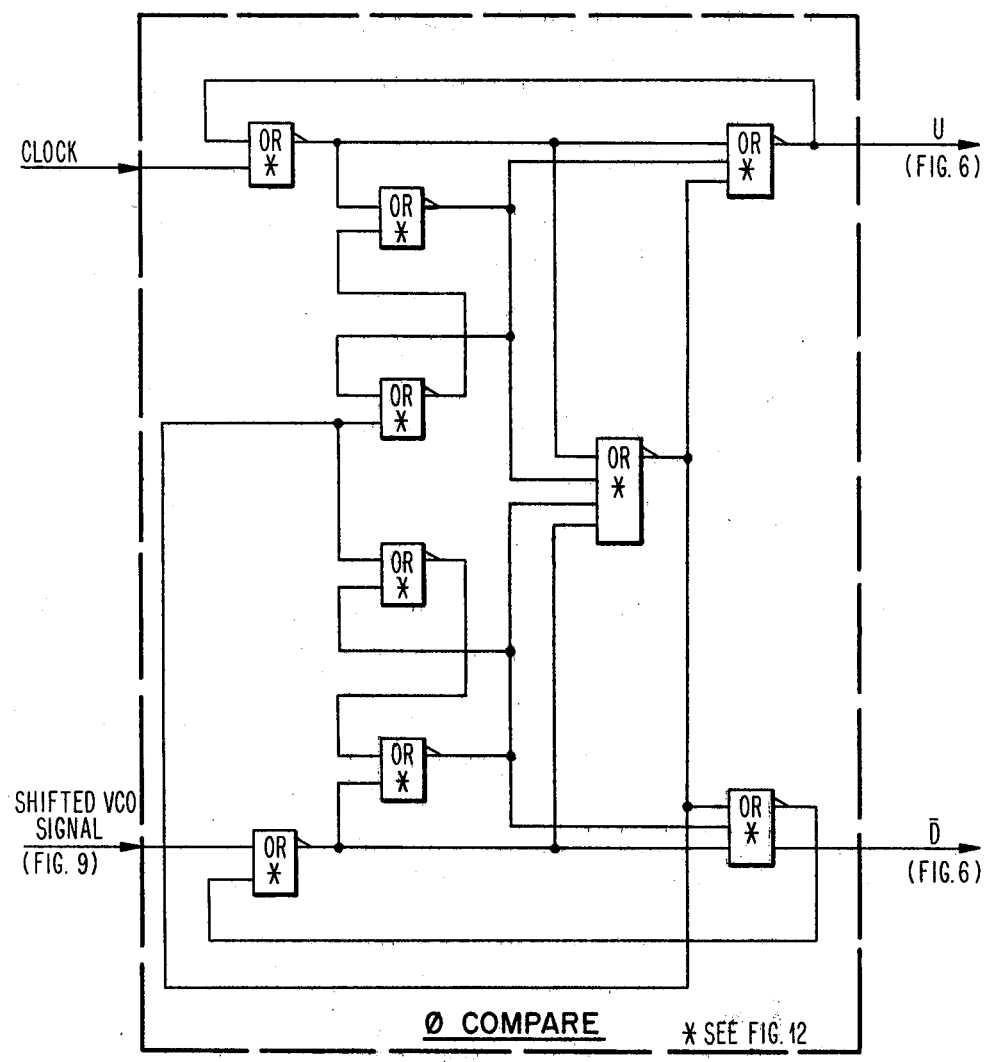
FIG. 5 discloses a logical block diagram of a phase comparator circuit which may be employed, in accordance with the invention, in the Delay Regulator (FIG. 4). [It is to be appreciated that the phase comparator may be logically the equivalent of the commercially available Phase Frequency Detector MC12040 of Motorola MECL Phase-Locked Loop Components].

FIG. 12 discloses an Internal Gate circuit of the current switch (or ECL) circuit family which may be utilized in the phase comparator of FIG. 5.

Figure 13:
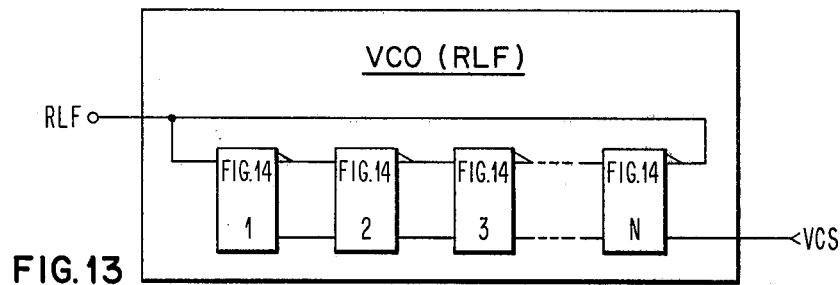
Figure 14:
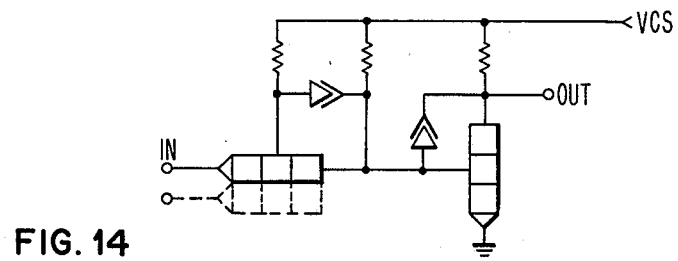

FIG. 13 is a block diagram of a voltage controlled oscillator (VCO-RLF) for use, in accordance with the invention, in the power control means of a system wherein the circuits whose delay is to be regulated or optimized are of the T²L technological circuit family (such as shown in FIG. 14).

FIG. 14 is a representative, or illustrative, T²L circuit whose delay, in accordance with the invention, may be regulated, or optimized, by the employment of a power control means including the Voltage Controlled Oscillator (RLF) of FIG. 13.

Figure 15:
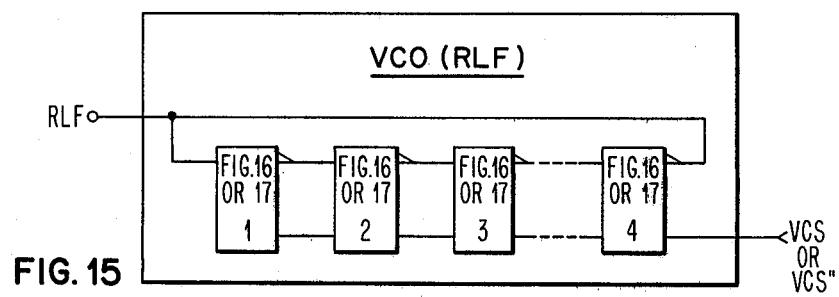
Figures 16, 17:
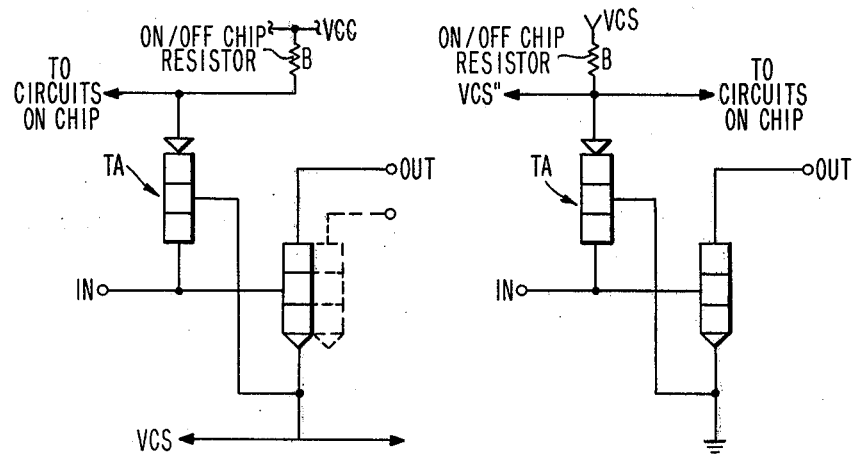

FIG. 15 is a block diagram of a voltage controlled oscillator for use, in accordance with the invention, in the power control means of a system wherein the circuits whose delay is to be regulated, or optimized, are of the I²L technological circuit family (such as shown in FIG. 16 or FIG. 17).

FIG. 16 is a representative, or illustrative, I²L circuit whose gate delay, in accordance with the invention, may be regulated, or optimized, by the employment of a power control means including the voltage controlled oscillator of FIG. 15.

FIG. 17 is a second representative, or illustrative, I²L circuit whose gate delay, in accordance with the invention, may be regulated, or optimized, by the employment of a power control means including the voltage controlled oscillator of FIG. 15.

Figure 18:
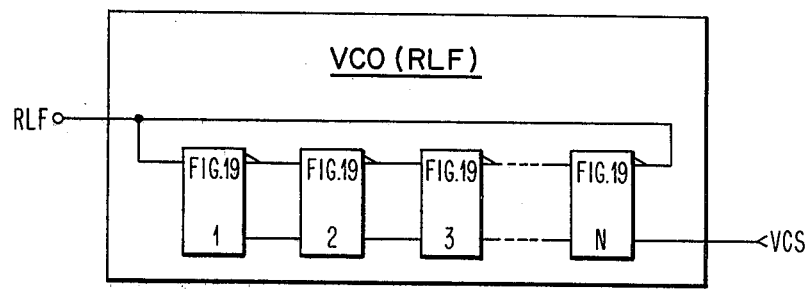
Figure 19:
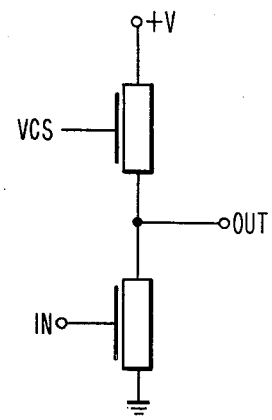

FIG. 18 is a block diagram of a voltage controlled oscillator for use, in accordance with the invention, in the power control means of a system wherein the circuits whose delay is to be regulated, or optimized, are of the F.E.T. technological circuit family (such as shown in FIG. 19).

FIG. 19 is a representative, or illustrative, F.E.T. circuit whose gate delay, in accordance with the invention, may be regulated, or optimized, by the employment of a power control means including the voltage controlled oscillator of FIG. 18.

DESCRIPTION OF THE PREFERRED EMBODIMENTS

Figure 1:
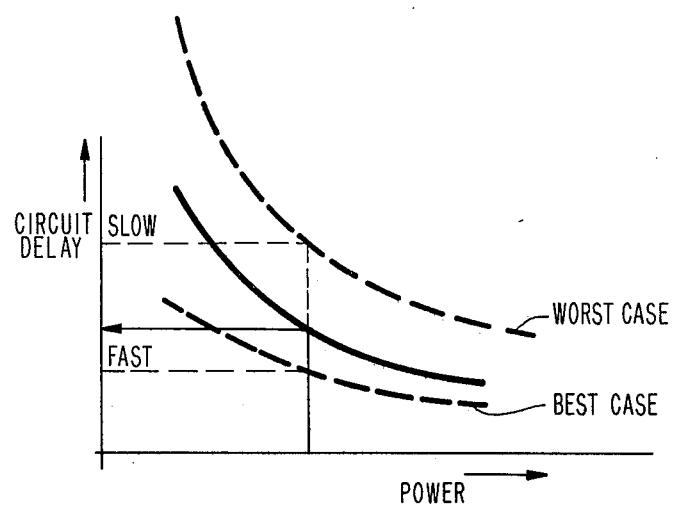
FIG. 1 discloses a gate delay versus power curve for a representative logic circuit. The curve of FIG. 1 depicts the prior art condition wherein the power is fixed, or chosen, and the speed or gated delay of the circuit is in accordance with the power supplied thereto. (Note the arrowhead opposite the legend "Gated Delay").

FIG. 1 shows a typical logic gate delay versus power curve which all logic families exhibit. Current practice is to operate a logic gate at a specific power level. This is evidenced by the many disclosures of circuitry designed to maintain a specific power level or current setting in the logic gate circuitry. The idea of trying to maintain the specific power or current setting has several problems. The first problem is related to the manufacturing of semiconductor devices. During the normal course of semiconductor manufacturing, there are minor perturbations to the process. These minor changes effect the position of the speed power curve as shown in FIG. 1. As the curve varies, the gate delay varies. The second problem is the support circuitry that is designed to maintain the specific power or current level in the logic circuit. These circuits are also subject to process changes and at the same time in the system are susceptible to power supply changes and temperature changes. The end result is a logic gate whose power is closely regulated but whose delay can vary considerably.

Figure 2:
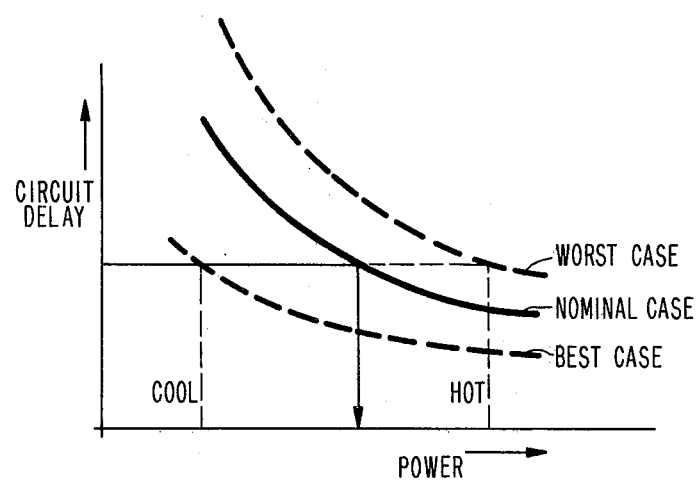
FIG. 2 discloses a gate delay versus power curve for a representative logic circuit. The gate delay (or speed) versus power curve of FIG. 2 is depicted in accordance with the invention wherein the gate delay (or speed) of each of a plurality of logic circuits on a chip (or chips) is fixed, or designed, and the power (current or voltage) supplied to the logic circuits is in accordance with the chosen or fixed speed. (Note the arrowhead above the legend "Power").

FIG. 2 shows the method in accordance with the invention. The gate delay is regulated while the power of the logic gate is permitted to vary so that as the speed power curve changes through process, temperature or power supply, the gate delay remains constant while the power varies.

Figure 3:
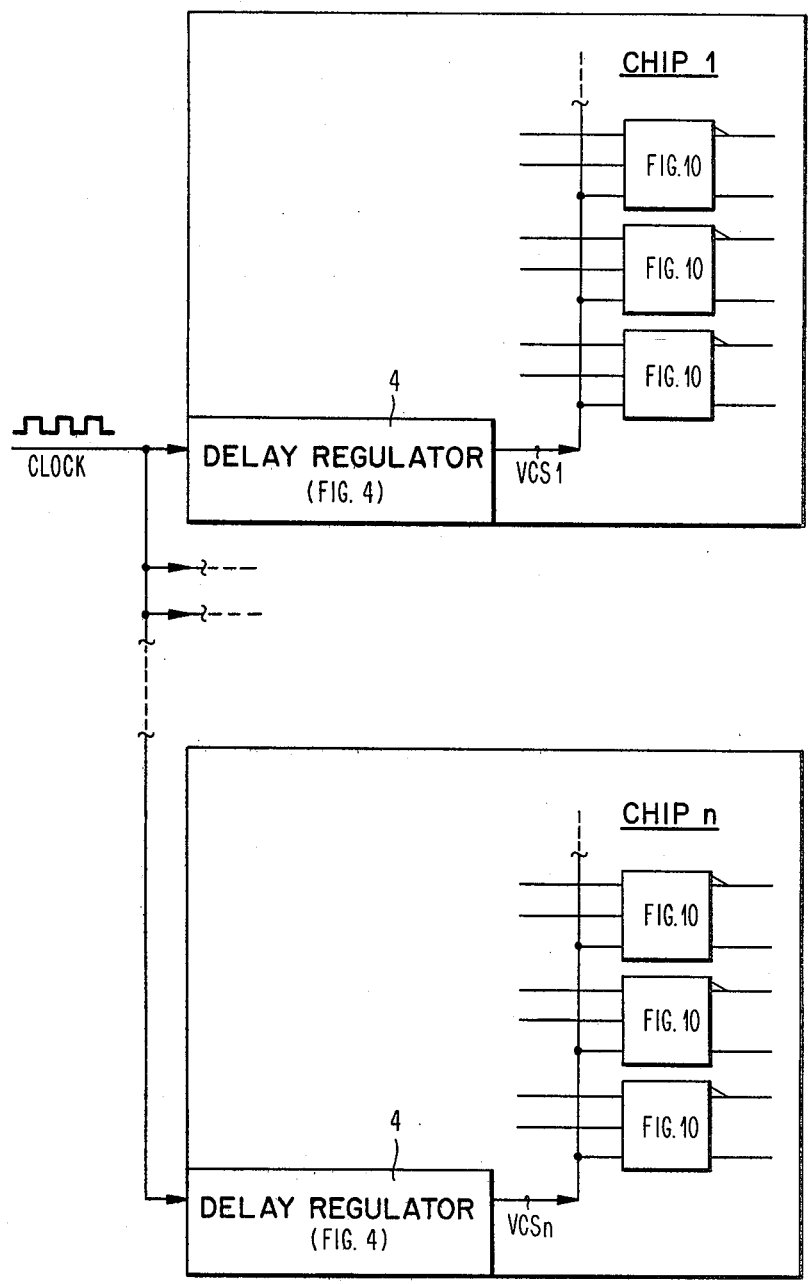
FIG. 3 discloses a block diagram in accordance with the invention. A plurality of integrated circuit chips 1 through N are depicted. Each integrated circuit chip includes a Delay Regulator and a plurality of interconnected logic circuits. In the drawing, only three logic circuits are shown. The logic circuits are respectively represented as blocks enclosing the legend "FIG. 10". Also, since it is not necessary to an understanding of the invention, the interconnections between the logic circuits on each chip and between chips are not shown. It will be appreciated by persons skilled in the art that each of the chips may contain hundreds of interconnected logic circuits. Also, that the invention is not limited to logic circuits of the type (current switch or ECL) shown in FIG. 10. From the detailed description hereinafter, it will be readily apparent to persons of ordinary skill in the art that the invention may be practiced with T²L, DTL, I²L and other technology families as well as arrays. Still referring to FIG. 3, it will be seen that the Delay Regulator 4 of each chip receives the same clock signal. Each of the Delay Regulators internally generates a discrete distinct on chip reference signal which in coaction with the clock signal causes the Delay Regulator to provide a unique signal Vcs (Voltage Current Source). For example, the Delay Regulator of chip 1 (FIG. 3) provides the signal Vcs1, whereas chip 2 Delay Regulator provides the signal Vcs2 (not shown), and chip N Delay Regulator provides the signal Vcsn. Further, magnitudes of the Vcs1, Vcs2 - - - to Vcsn will not necessarily bear any fixed relationship one to another. The magnitude or values of each of the potentials Vcs1, Vcs2 - - - to Vcsn will dictate a point on the gate delay (speed) versus power curve associated with its chip which will provide the desired speed.

FIG. 3 illustrates the implementation of the invention at the system level. The system may consist of N chips, such as shown chips 1 through N. On each chip there will be a delay regulator circuit which will control the power to the remaining logic gates on the chip. In this example, we are using the logic gates shown in FIG. 10 which are the current switch technology. The signal VCS is used to control the power in the logic gate by controlling the current source voltage. The clock signal shown in FIG. 3 goes to the delay regulator circuitry of each of the N chips. This clock signal contains the speed or timing information for the delay regulation circuit. The delay regulator circuit takes this clock signal, compares it to an on chip speed sensing circuit and then adjusts the power within the logic gates on the chip to obtain the same speed as the clock dictates. In this manner, the speed from chip to chip is the same while the power varies chip to chip. Since all the chips in the system will have logic gates with the same speed, the system designer must no longer design for slow chips and fast chips in a specific gate path. All chips will have the same gate delay. It is to be appreciated that the clock signal is preferably the system clock signal. However, it will be evident from the detailed description hereinafter that the clock signal applied to the delay regulator may be other than the system clock.

FIG. 4 shows an example of an embodiment of delay regulation. The delay regulator circuit consists of the phase compare, the low pass filter, the buffer, the VCO and the level shift circuitry. The phase compare circuitry compares the off-chip clock signal to the shifted VCO signal. The outputs U and $\overline{D}$ create a signal which has a pulse width directly proportional to the phase difference of the input clock signal and shifted VCO signal. This pulse width sensitive signal has a frequency the same as the input clock frequency. The signals U and D go to the low pass filter which removes this carrier input clock frequency from the signal. The output VCS' is a DC voltage which is proportional to the pulse width input to the low pass filter. VCS' goes to the buffer circuitry. The buffer circuit is an amplifier with gain of one. It has a high input impedance for the low pass filter signal VCS'. The buffer also has a low output impedance to drive the VCS signal to the other gates on the chip and to the VCO circuitry. The VCS signal controls the power in the logic gates on the chip. In this particular example (see FIG. 10), the signal VCS controls the current in the current source of the logic gate. Increasing VCS increases the power in the circuit whereas decreasing VCS decreases the power in the circuit. The voltage control oscillator produces a signal RLF whose frequency is proportional to the input VCS signal. The VCO circuit should have the same speed power sensitivities as the logic gates on the remaining part of the chip. Thus, as the VCS signal changes the gate delay on the logic gate, it also changes the frequency of the VCO. The output signal RLF is a periodic logic signal. The output VR is the logic threshold about which the RLF signal changes. These two signals go to the level shift circuit which produces an output signal, shifted VCO signal, which has the same logic level as the input clock and at the same frequency as the signal RLF. It can be seen that this arrangement of the phase compare, the low pass filter, the buffer, the VCO and the level shift circuitry creates a phase lock loop.

By using this phase lock loop technique, the VCO will tend to lock onto the input clock signals. This phase lock loop action will tend to reject process changes, temperature changes and power supply changes within the ability of the VCO to lock onto the clock. Once the VCO has locked, the remaining logic gates on the chip have had their power changed so that the gate delay now becomes controlled by the input clock frequency signal. It can be seen the input clock signal which now at the system level goes to all chips controls the gate delay on each individual chip, regardless of the power the logic gate dissipates or the temperature of the chip or the lot to lot process changes which occur during the manufacturing of the chip.

It can also be seen that the phase compare, low pass filter, buffer and level shift circuitry need not be on the chip itself. The important circuitry to be on the chip is the VCO (RLF) which senses the speed or gate delay which exists on the chip. These other four logic circuit blocks (FIGS. 5, 6, 7 and 9) can exist off chip on another chip or even be composed of discrete components. The VCO (RLF), however, must exist on the same chip as the logic gates which are to be controlled.

FIG. 5 is a logic diagram of the phase compare circuitry. This circuit may be a commercially available part number. For example, Motorola part number MC12040 entitled "Phase Frequency Detector" of Motorola's MECL Phase-Lock Loop Components. In this example, the logic gates are composed of the circuits in FIG. 12. The function of this logic circuit is to compare the phase of the two input signals, the off chip system clock and the shifted VCO signal, and produce a logic signal at the outputs U and $\overline{D}$ which has the same frequency as the input signals and has a pulse width proportional to the phase difference of the two input signals.

Figure 6:
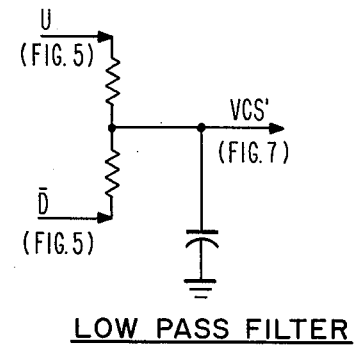
FIG. 6 discloses a Low Pass Filter circuit which may be employed, in accordance with the invention, in the Delay Regulator (FIG. 4).

FIG. 6 is a diagram of the low pass filter. The inputs U and $\overline{D}$ are added together and filtered to remove the carrier frequency. The output VCS' is a DC signal. The cutoff frequency of the low pass filter is designed to minimize the ripple on VCS' and at the same time maintain stability within the phase locked loop.

FIG. 11 is a reference generator. The voltage is generated by elements TA, TB, TC and TD. Element TE is used to drive signal Vref to the other circuits. The reference voltage output of this circuit is used as a logic threshold by the logic gates in FIG. 12 for the phase compare circuit in FIG. 5. This reference signal Vref is also used by the level shift circuit in FIG. 9. This voltage is used as a reference voltage for the logic signals.

FIG. 8 is the VCO circuit. It consists of N logic gates, which are individually shown in FIG. 10, connected in a loop configuration where gate 1 output goes to gate 2 input and this succeeds down through the line through gate N whose output is brought back to the input of gate 1. This circuit will oscillate at a frequency which is dependent upon the gate delay of the N elements. The actual gate delay of each element is controlled by signal VCS. It can be seen that the signal VCS changes the power in each gate. Each gate delay change results in a change of frequency of signal RLF. As the signal VCS is increased the RLF frequency will increase and as the VCS signal is decreased the RLF frequency will decrease. The output of this circuit RLF goes to the level shift circuit. Signal VR is the logic reference signal of the gates in this loop.

FIG. 9 is the level shift circuit. Its purpose is to change the logic level of the signal RLF to signals which are compatible with the off chip clock signal shown in FIG. 4. The signal RLF changes between voltage levels above signal VR and below signal VR. Elements TA, TB, TC and D comprise a logic gate switch configuration where the current through element TC goes through either element TA or element TB, depending on the input voltage RLF. The signal Vref which is derived from FIG. 11 is used for two functions. The first function is to generate a reference current for the current source elements TC and D. This reference current is created using elements G, TF and E and conveyed to the current source elements TC and D using a current mirror configuration, the connection between TF and TC. The second function of the Vref is clamping the output signal shifted VCO signal using diodes J and H so that the output signal is a diode drop above the Vref or a diode drop below the Vref. The operation of the circuit in FIG. 9 is controlled by the input signal RLF. When this input signal voltage is above the voltage VR, the current through element TC is directed through element TA. The current through element K goes through element J which produces a diode drop above signal Vref for the shifted VCO signal. When the signal RLF is below the voltage VR, the current through element TC goes through element TB pulling all of the current through element K through element TB and also pulling current from the signal Vref through element H. This produces a low level signal a diode drop below Vref at the output for shifted VCO signal. It can be seen that the action of this circuit is to move the voltage reference of the logic input RLF to the reference to Vref. The output will be of the same frequency as RLF but of a different logic level.

FIG. 12 is a logic diagram of an internal gate used in the phase compare circuit of FIG. 5. The operation of this gate is similar to that of a current switch technology gate. The reference Vref is generated by the circuit in FIG. 11. The outputs are clamped levels either a diode drop above or a diode drop below the signal Vref. The circuit in FIG. 12 is shown with only two input transistors TA and TB, but other additional transistors may be connected in the same manner to supply a three or four input logic gate. A voltage at input 1 or input 2 which is above the input Vref will direct the current through that transistor and pull the output $\overline{\phi}$ a diode drop below Vref. The output $\phi$ will be a diode drop above Vref. If inputs 1 and 2 are both below Vref, the current will be directed through element TC and will pull the $\phi$ signal a diode drop below Vref. The $\overline{\phi}$ output will be a diode drop above Vref. The outputs in the circuit are diode clamped in order to provide the proper voltages to control the remaining part of the phase lock loop shown in FIG. 4.

FIG. 10 is a diagram of a typical logic gate to be used in both the VCO (FIG. 8) and also the logic gates on the rest of the chip as shown in FIG. 4. Elements TD and E form a current source which is controlled by a signal VCS. VCS therefore directly controls the power within the logic gate and thus its speed. The logic gate is shown connected with two inputs, transistors TA and TB, but they also include additional transistors to be used as inputs connected in the same manner. The outputs $\overline{\phi}$ and $\phi$ are diode clamped to the VR signal suchs that the outputs are either a diode drop above or a diode drop below signal VR. The inputs 1 and 2 to the circuit are either above the signal VR or below the signal VR such that when either input 1 or input 2 is above VR the current from element TD is directed through that ON transistor. The output φ then becomes a diode drop below VR. If neither 1 nor 2 is above the voltage VR, then the output $\overline{\phi}$ becomes a diode drop above VR. In the same manner, if both inputs 1 and 2 are below VR, the current from element TD is directed through element TC so that φ signal becomes a diode voltage drop below VR. If either inputs 1 or 2 are ON, then the output φ will be a diode drop above VR. The signal VR goes to all the logic gates on the chip controlled by the delay regulator, including those logic gates composed in the VCO of FIG. 8 so that all these logic gates are using the same threshold voltage.

Figure 7:
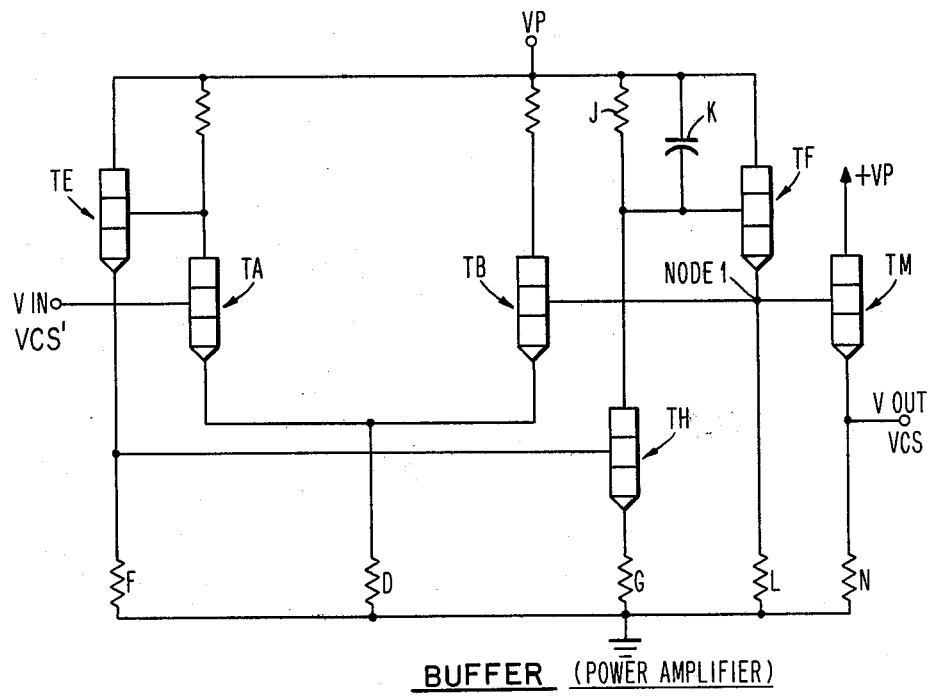
FIG. 7 discloses a Buffer Circuit which may be employed, in accordance with the invention, in the Delay Regulator (FIG. 4). It will be appreciated that the Buffer Circuit performs the function of, and may be termed, a power amplifier.

The circuit in FIG. 7 is a buffer circuit. It provides a high input impedance to the signal VCS' and provides a low output impedance drive for the VCS signal so that this signal may be driven over the entire chip to all logic gates as shown in FIG. 4. This circuit is a differential amplifier which has a gain of one. The elements TA, TB and D form the differential operation of the circuit. The input VCS' is compared to the signal at node 1 using the elements TA and TB and D. Elements TE, TF, G, TH, J and K provide the necessary signal conditioning so that the signal at node 1 is identical to input VCS'. Element TM and N provide additional output buffering and voltage translation to provide signal VCS which is provided to the logic gates and VCO (RLF) as shown in FIG. 4.

Figure 4A:
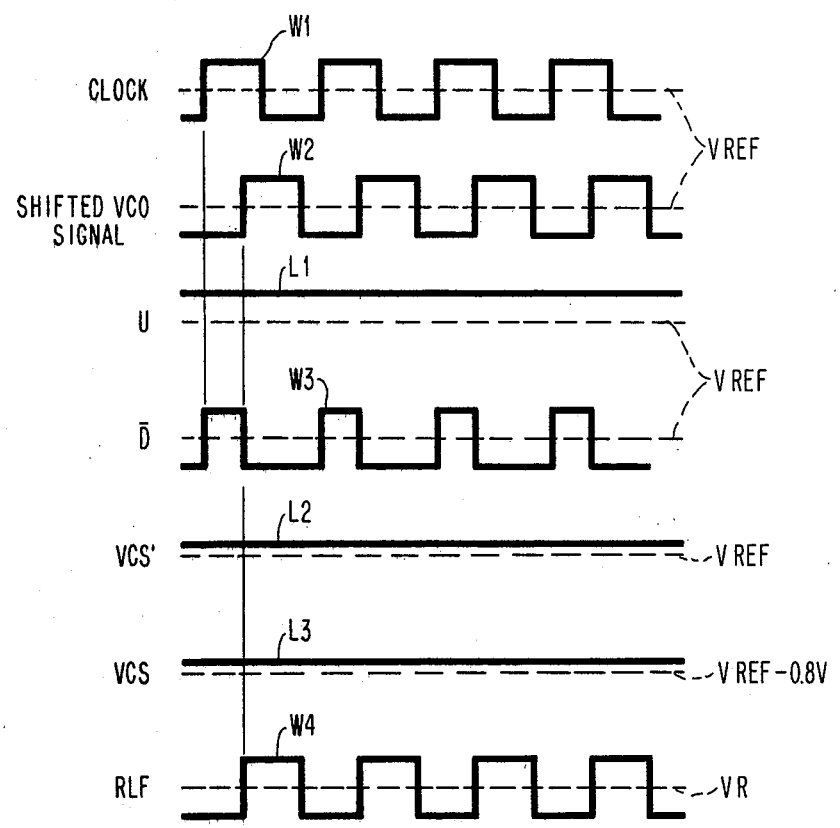
FIG. 4A shows idealized waveforms and potential levels to be viewed in conjunction with the explanation of the operation of the Delay Regulator (FIG. 4).

FIG. 4A discloses a number of waveforms and potential levels that are to be viewed in conjunction with the explanation of the operation of the delay regulator of FIG. 4. The inputs to the phase comparator of FIG. 4 are respectively waveform W1 (clock) and waveform W2 (shifted VCO signal). As seen from FIG. 4A, each of these waveforms has a portion of each pulse period which is above Vref and a lower level portion which is below Vref. Also apparent from waveforms W1 and W2 of FIG. 4A is that waveforms W1 and W2 each have the same periodicity or pulse repetition rate. However, clock waveform W1 leads in phase shifted VCO signal waveform W2. The output of the phase comparator U is a steady level represented by L1 in FIG. 4A. It will be noted that L1 has a magnitude greater than Vref. Further, it will be seen from FIG. 4A that output $\overline{D}$ is waveform W3. Waveform W3 is a periodic pulse train having a periodicity equal to that of waveform W1. Also, it will be seen that the duration of the pulses in waveform W3 are equal to or directly proportional to the phase difference between waveforms W1 and W2. As seen from FIG. 4A, signal VCS' is a steady state level L2. The magnitude L2 of signal VCS' is a function of the average potential of the signals U (L1) and $\overline{D}$ (waveform W3) and the duration of the pulses of waveform W3. As will be appreciated from the earlier explanation herein of the function of the buffer circuit (FIG. 7), VCS has a magnitude L3 which is a transistor VBE below the magnitude L2 of signal VCS'. Still referring to FIG. 4A, it will be seen that the magnitude L2 of signal VCS' is an increment, for example Δ, above the magnitude of Vref and the signal VCS which has been shifted by a DC magnitude of 0.8 of one volt is also a Δ above Vref-0.8 volt. Waveform W4 represents a periodic pulse train corresponding to the signal RLF of FIGS. 4 and 8. Also shown is the magnitude of VR. It will be seen from FIG. 4A that waveform W2 (shifted VCO signal) and waveform W4 (RLF) correspond one to another in periodicity and pulse duration. As seen from FIG. 4, waveform W4 (RLF) is shifted by level shifter circuit (FIG. 9) and becomes shifted VCO signal, the output of level shift circuit of FIG. 4.

As explained earlier herein, it is to be appreciated that the signal VCS (L3) is the output of the buffer of the delay regulator of FIG. 4. This magnitude or output VCS is utilized in accordance with the invention in determining the point on the gate delay versus power characteristics at which the logic circuits operate. Thus, this magnitude is determinative of the constant speed or gate delay of the logic circuit receiving the signal VCS.

FURTHER ILLUSTRATIVE EMBODIMENTS OF THE INVENTION

FIG. 13 shows the VCO circuit used in the TTL configuration. The input signal to the circuit, VCS, controls the power in each logic gate (FIG. 14). As explained previously, changing the power in the VCO logic gates results in a frequency change in signal RLF. Referring to FIG. 4, the implementation of TTL in this preferred embodiment may not require the level shift circuit (FIG. 9) to change the logic voltage levels of the signal RLF. If no level shift circuit is needed, as would be readily determined by someone skilled in the art, the signal RLF (referring to FIG. 4) would replace the signal shifted VCO signal as the input to the φ compare circuit (FIG. 5). Also, signal VR and shifted VCO signal would be removed from the circuit since they are no longer required. However, if it is determined, by someone skilled in the art, that a level shift circuit is needed, the new level shift circuit may not require the signal VR to produce a signal shifted VCO signal compatible with the φ compare circuit. Persons skilled in the art will also note, using TTL or any other logic in the φ compare logic may require additional circuits in order for signals U and $\overline{D}$ (FIG. 4) to appear as proper source impedances, and/or voltage/current levels, and/or temperature/power supply corrections for proper delay regulation circuit (FIG. 4) operation.

FIG. 4 is an example of a TTL gate which may be used in the VCO circuit of FIG. 13. Other configurations of TTL, which are known in the art, may also be used. The signal VCS, produced by the buffer circuit, or power amplifier (FIG. 7), goes to all the logic gates in the VCO circuit (FIG. 13) and to the logic gates on the remaining portion of the chip (not shown) which may or may not include the φ compare circuit (FIG. 5). The control signal VCS varies the power in the logic gate (FIG. 14). As VCS is increased, power is increased to the logic gate resulting in a decrease in gate delay. In the same manner, as VCS is decreased, the power is decreased to the logic gate resulting in an increase in gate delay. It will be appreciated by those skilled in the art that the voltage level of signal VCS may be increased only to the voltage level where any further increase in voltage level no longer obtains a decrease in gate delay.

FIG. 15 shows the VCO circuit used in the I$^2$L configuration. The input signal to the circuit, VCS for the logic gate in FIG. 16, or VCS" for the logic gate in FIG. 17, controls the power in each logic gate. As explained previously, changing the power of the VCO logic gates results in a frequency change in signal RLF. As discussed above in describing the use of TTL in the VCO circuit, the level shift circuit may or may not be needed, the signal(s) shifted VCO signal and/or VR may or may not be needed, and additional circuits for proper delay regulation circuit (FIG. 4) operation may or may not be needed.

FIGS. 16 and 17 are two examples of controlling the power to an I²L gate. FIG. 16 shows the current through element TA being controlled by a variable voltage VCS. The voltage VCC is fixed so that as the voltage of signal VCS is decreased, the power to the logic gate is increased therefore decreasing the logic gate delay. In the same manner, as the voltage of signal VCS is increased, the power to the logic gate is decreased, which in turn increases the logic gate delay. It will be appreciated by those skilled in the art in order to obtain proper delay regulation circuit (FIG. 4) operation, the signals U and $\overline{D}$ produced by the $\phi$ compare circuit (FIG. 5) must be logically inverted ($\overline{U}$ and D).

FIG. 17 shows an I²L gate being controlled by a voltage variation over element B. The base connection of element TA is connected to "ground" so that as signal VCS varies, the current through element TA changes. As the voltage of signal VCS increases, the power increases in the logic gate, therefore the logic gate delay is decreased. In the same manner, as the voltage of signal VCS decreases, the power decreases in the logic gate, therefore the gate delay increases. It should be appreciated that for this particular logic gate, VCS will not be distributed to the VCO and remaining logic gates on the chip. Instead, signal VCS" will be distributed to the VCO and remaining logic gates on the chip.

FIG. 18 shows a VCO circuit which may be used in an F.E.T. embodiment. The input signal, VCS, controls the power to each F.E.T. logic gate (FIG. 19). As previously explained, changing the power in the VCO gates results in a frequency change in signal RLF. Also, increasing the power to the F.E.T. logic gate (FIG. 19) reduces the delay and decreasing the power to the logic gate increases the delay.

In view of the aforegoing detailed explanation of applicants' preferred embodiment of the invention, it will be readily apparent to persons skilled in the art that a number of modifications to applicants' invention may be made without departing from the spirit and scope of applicants' invention.

For example, the following numbered paragraphs summarize a limited number of changes and modifications which may be made to applicants' invention without departing from the spirit and scope thereof.

1. Not necessary to use a phase locked loop. A frequency locked loop may be used.
2. System clock not necessary—may use a separate clock.
3. Inverters not necessarily the only type of gate which may be used for [(VCO) RLF] loop.
4. Frequency comparison may be made by two RC filters and a voltage comparison.
5. May have more than one regulator on a chip.
6. Buffer circuit, or power amplifier, may have a gain other than 1.
7. Low pass filter may be incorporated into the buffer circuit.

The concept of the invention may be summarized as set forth in the following paragraphs:

Any circuit exhibiting a speed-power relationship may have its speed adjusted, or regulated, in-situ by varying the power to it.

The means by which the power may be varied is accomplished by a feedback loop consisting essentially of an oscillator (built up from the circuit to be adjusted) signal, a reference signal (clock), a means for comparing the reference and oscillator signals and generating an "error" signal, and a means for converting the error signal into the appropriate control.

The oscillator may be constructed in any one of a number of ways familiar to those skilled in the art; for purposes of explanation, the use of a RLF VCO has been described. The reference signal has been referred to as a clock signal.

The comparator which serves a function of frequency to either voltage or current conversion may be any means available to those skilled in the art such as pulse width modulation, D flip flops, D to A converters or Phase Locked Loops. For purposes of explanation, the use of a Phase Comparator Phase Locked Loop has been expressly described in detail herein.

While the invention has been particularly shown and described with reference to a preferred embodiment thereof, it will be understood by those skilled in the art that the foregoing and other changes in form and detail may be made therein without departing from the spirit and scope of the invention.

What we claim is:

1. In an electronic system including one or more interconnected integrated circuit chips, each of said one or more integrated circuit chips having a plurality of interconnected logic circuits thereon, each of said logic circuits having a gate delay versus power curve, said system being characterized by the inclusion of power control means for regulating the power to each of said one or more chips whereby the power provided to said logic circuits on said one or more integrated circuit chips may vary chip to chip but said gate delay of said logic circuits on each of said one or more integrated circuit chips will be essentially equal one to another.

2. In an electronic system including one or more interconnected integrated circuit chips, as recited in claim 1, wherein said system is further characterized in that said power control means consists of a discrete delay regulator means contained on each chip of said one or more interconnected integrated circuit chips.

3. In an electronic system including one or more interconnected integrated circuit chips, as recited in claim 2, wherein said system is further characterized in that each of said discrete delay regulators is adapted to receive a periodic clock pulse and generate an on chip periodic pulse, said generated on chip periodic pulse having a periodicity related to a point on said gate delay versus power curve of the logic circuits on the chip on which said generated on chip periodic pulse is generated.

4. In an electronic system including one or more interconnected integrated circuit chips, as recited in claim 3, further characterized in that each of said discrete delay regulator means compares said period clock pulse with its on chip generated periodic pulse and provides an electrical manifestation representative of the result of the comparison of said periodic pulses.

5. In an electronic system including one or more interconnected integrated circuit chips, as recited in claim 4, wherein said system is further characterized in that each of said delay regulators includes means for providing its electrical manifestation in the form of a voltage.

6. In an electronic system, said system including:

N interconnected integrated circuit chips, where N is an integer positive number, each of said N interconnected integrated circuit chips containing a delay regulator means and at least first, second and third interconnect logic circuits, said logic circuits on each of said chips having a relatively unique speed/power characteristic;

a source of periodic clock pulses;

said delay regulator means of each of said N interconnected circuit chips being adapted to receive said period clock pulses, each of said delay regulator means including active circuit means for generating an electrical manifestation related to said periodicity of said periodic clock pulses and said speed power characteristic of the logic circuits on the chip on which it is contained; and connection means on each of said N interconnected integrated circuit chips, said connection means on each of said N interconnected integrated circuit chips conveying the electrical manifestation generated by the delay regulator means on said chip to said logic circuits on said same chip, whereby the power provided to said logic circuits on said chips may vary chip to chip but said speed of said logic circuits on each of said chips will be essentially equal one to another and to the desired speed.

7. In an electronic system, as recited in claim 6, wherein each of said delay regulator means essentially consists of a phase-locked loop.

8. In an electronic system, as recited in claim 6, wherein each of said delay regulator means of each of said N integrated circuit chips includes means for generating an on chip signal, each of said on chip generated signal of said N chips bearing a detectable relationship to the speed/power characteristics of the logic circuits on said same chip.

9. In an electronic system, as recited in claim 8, wherein each of said on chip generated signals of said N chips is a periodic pulse train and each of said detectable relationships is the periodicity of the on chip generated periodic pulse train.

10. In an electronic system, as recited in claim 6, wherein said generated electrical manifestation of each said delay regulator means is an electrical potential.

11. In an electronic system, as recited in claim 10, wherein each of said first, second and third interconnected logic circuits of each of said N interconnected integrated circuit chips is a current switch logic circuit.

12. In an electronic system, as recited in claim 6, wherein each of said delay regulator means comprises:
a phase comparator circuit having first and second inputs and an output, said first input of said phase comparator circuit being adapted to receive said periodic clock pulses;
a low pass filter circuit having an input connected to said output of said phase comparator and an output;
a buffer circuit (or power amplifier) having an input connected to said output of said low pass filter circuit and an output;
a voltage controlled oscillator means having an input connected to said output of said buffer circuit and an output; and
a level shift circuit having an input connected to said output of said voltage controlled oscillator and an input connected to said second input of said phase comparator circuit.

13. In an electronic system, as recited in claim 12, wherein each of said first, second and third interconnected logic circuits have a speed/power characteristic which is directly electrically controllable by an electrical potential and wherein each of said electrical manifestations generated by the delay regulator means on each of said chips is an electrical potential.

14. In an electronic system, as recited in claim 12, wherein said voltage controlled oscillator means of each said delay regulator means comprises a recirculating loop frequency (RLF) means consisting essentially of a plurality of binary circuits each having an input and an output and serially connected in an enclosed loop with each binary circuit having its input connected to the output of a predetermined one of said plurality of binary circuits and its output connected to the input of another predetermined one of said binary circuits.

15. In an electronic system, as recited in claim 14, wherein said plurality of binary circuits includes an odd integer number of inverter circuits.

16. In an electronic system, said system comprising: at least first and second integrated circuit chips, said first chip containing at least first and second circuits, said first and second circuits of said first chip each having a gate delay versus power characteristic which is essentially identical one to the other, said second chip containing at least third and fourth circuits, said third and fourth circuits of said second chip each having a gate delay versus power characteristic which is essentially identical one to the other, a first delay regulator means contained on said first chip, said first delay regulator means being connected to said first and second circuits of said first chip, said first delay regulator means cooperating with a first periodic pulse source and said first and second circuits of said first chip to cause said first and second circuits to each have the same relatively constant gate delay, a second delay regulator means contained on said second chip, said second delay regulator means being connected to said third and fourth circuits of said second chip, said second delay regulator means cooperating with a second periodic pulse source and said third and fourth circuits of said second chip to cause said third and fourth circuits to each have the same relatively constant gate delay.

17. In an electronic system, as recited in claim 16, wherein said first delay regulator means and said second delay regulator means are logically equivalent one to the other, wherein said first periodic pulse source and said second periodic pulse source are provided by a single periodic pulse source having a relatively invariant pulse repetition rate, and wherein said first and second circuits of said first chip and said third and fourth circuits of said second chip are each of the same technological family such as current switch.

18. In an electronic system, as recited in claim 16, wherein said first delay regulator means and said second delay regulator means are logically similar one to the other, wherein said first periodic pulse source provides a first pulse train having a first pulse repetition rate, said second periodic pulse train provides a second pulse train having a second pulse repetition rate said first and second pulse repetition rates being unequal one to the other, wherein said first and second circuits of said first chip are respectively members of the current switch technological family and said third and fourth circuits of said second chip are respectively members of a like technological family other than said current switch technological family.

19. In an electronic system, said system comprising: at least a first integrated circuit chip said first integrated circuit chip containing at least first, second, third and fourth circuits, said first and second circuits each having a gate delay versus power characteristic which is essentially identical one to the other, said third and fourth circuits each having a gate delay versus power characteristic which is essentially identical one to the other, a first delay regulator means contained on said first chip, said first delay regulator means being connected to said first and second circuits, said first delay regulator means responding to a first periodic pulse train to cause said first and second circuits to each have the same relatively constant gate delay, said second delay regulator means being connected to said third and fourth circuits, said second delay regulator means responding to a second periodic pulse train to cause said third and fourth circuits to each have the same relatively constant gate delay.

20. In an electronic system, as recited in claim 19, wherein said first and second circuits are respectively logical circuits of the current switch technological family and said third and fourth circuits are respectively logical circuits of a technology family other than current switch.

21. In an electronic system, as recited in claim 19, wherein the pulse repetition rate of said first pulse train is higher than the pulse repetition rated of said second pulse train whereby the gate delay of each of said first and second circuits is less than the gate delay of said third and fourth circuits.

22. An integrated circuit chip, said integrated circuit chip comprising:
   a plurality of logic circuits each having a gate delay versus power characteristic which is essentially identical one to the other;
   a delay regulator, said delay regulator being adapted to receive a clock pulse train, said delay regulator including a voltage controlled oscillator for providing an on chip generated periodic pulse train, said on chip generated periodic pulse train having a repetition rate related to said gate delay versus power characteristic of said plurality of logic circuits;
   comparison means contained within said delay regulator for comparing the phase relationship between said clock pulse train and said on chip generated periodic pulse train, said comparison means rendering an indication of the result of said comparison of the phase relationship between said clock pulse train and said on chip generated periodic pulse train; and
   circuit means connected between said comparison means of said delay regulator and each of said plurality of logic circuits for utilizing said indication of the phase relationship between said clock pulse train and said on chip generated periodic pulse train to regulate the gate delay of each of said plurality of logic circuits on said chip.

23. In an electronic system including one or more interconnected integrated circuit chips, each of said one or more integrated circuit chips having a plurality of interconnected circuits thereon, each of said circuits having a delay versus power curve, said system being characterized by the inclusion of power control means for regulating the power to each of said circuits on each of said one or more chips whereby the delay of each of said interconnected circuits on each of said one or more interconnected integrated circuit chips is rendered essentially equal one to another and the desired delay.

24. In an electronic system, as recited in claim 23, wherein said plurality of interconnected circuits are respectively members of the $T^2L$ technological family of circuits.

25. In an electronic system, as recited in claim 23, wherein said plurality of interconnected circuits are respectively members of the $I^2L$ technological family of circuits.

26. In an electronic system, as recited in claim 23, wherein said plurality of interconnected circuits are respectively members of the ECL technological family of circuits.

27. In an electronic system, as recited in claim 23, wherein said plurality of interconnected circuits are F.E.T. type circuits.

* * * * *

UNITED STATES PATENT AND TRADEMARK OFFICE
CERTIFICATE OF CORRECTION

PATENT NO. : 4,346,343

DATED : August 24, 1982

INVENTOR(S) : Erich Berndlmaier, Jack A. Dorler, Joseph M. Mosley, Stephen D. Weitzel It is certified that error appears in the above—identified patent and that said Letters Patent is hereby corrected as shown below:

Column 17, line 34     "signal" should read --signals--.

Column 19, line 12     after "delay," insert --a second delay regulator means contained on said first chip,--.

Column 20, line 22     "each of said circuits on" should be deleted.

Signed and Sealed this

Twelfth Day of July 1983

[SEAL]

Attest:

GERALD J. MOSSINGHOFF

Attesting Officer     Commissioner of Patents and Trademarks